United States Patent [19]

Eguchi

[11] Patent Number: 5,182,235
[45] Date of Patent: Jan. 26, 1993

[54] MANUFACTURING METHOD FOR A SEMICONDUCTOR DEVICE HAVING A BIAS SPUTTERED INSULATING FILM

[75] Inventor: Kouzi Eguchi, Itami, Japan

[73] Assignee: Mitsubishi Denki Kabushiki Kaisha, Tokyo, Japan

[21] Appl. No.: 703,945

[22] Filed: May 22, 1991

Related U.S. Application Data

[60] Division of Ser. No. 224,171, Jul. 25, 1988, Pat. No. 5,028,981, which is a continuation of Ser. No. 932,221, Nov. 18, 1986, abandoned, which is a continuation-in-part of Ser. No. 809,883, Dec. 17, 1985, abandoned.

[30] Foreign Application Priority Data

Feb. 20, 1985 [JP] Japan .................. 60-33735

[51] Int. Cl.⁵ .......................... H01L 21/283
[52] U.S. Cl. ....................... 437/238; 437/180; 437/187; 437/235; 204/192.22; 204/192.23; 148/DIG. 118
[58] Field of Search ........... 204/192.1, 192.12, 192.15, 204/192.22, 192.23; 148/DIG. 118, 180; 437/235, 238, 187

[56] References Cited

U.S. PATENT DOCUMENTS

| | | |
|---|---|---|
| 3,868,723 | 2/1975 | Lechaton et al. |
| 4,007,103 | 2/1977 | Baker et al. .................. 204/192.23 |
| 4,221,649 | 9/1980 | Tisone et al. ................. 204/192.23 |
| 4,601,781 | 7/1986 | Mercier et al. ............... 437/238 |
| 4,732,761 | 3/1988 | Machida et al. .............. 437/238 |
| 4,749,663 | 6/1988 | Okita ............................. 437/238 |
| 5,006,485 | 9/1991 | Villalon ......................... 437/238 |

FOREIGN PATENT DOCUMENTS 0284564 12/1986 Japan .................. 204/192.23
2088629 6/1982 United Kingdom.

OTHER PUBLICATIONS

Logan, "Control of RF Sputtered Film Properties Through Substrate Tuning", IBM J. Res Develop, Mar. 1970, pp. 172–175.
Kennedy, "Sputtered Insulator Film Contouring Over Substrate Topography", J. Vac. Sci. Technol., vol. 13, No. 6, Dec./Nov. 1976, pp. 1135–1137.
Mumtax, "RF Magnetron Sputtered Silicon Dioxide With RF Bias", Matls. Res. Corp.
Patent Abstracts of Japan, vol. 9, No. 61, Mar. 19, 1985 "Manufacture of Wiring Structure", Tooru Mogami.

Primary Examiner—Mary Wilczewski
Attorney, Agent, or Firm—Lowe, Price, LeBlanc & Becker

[57] ABSTRACT

To cover a conductive interconnection (2) of a semiconductor device (1) at high speed with an insulating film (3) having good step coverage, a conductive dummy pattern (8) is provided around the interconnection (2) in spaced relationship therewith. The dummy pattern (8) and interconnection (2) are then covered with insulating film 3 using the bias sputtering method. The dummy pattern (8) and interconnection (2) are preferably applied simultaneously to the substrate using a single mask.

4 Claims, 1 Drawing Sheet

MANUFACTURING METHOD FOR A SEMICONDUCTOR DEVICE HAVING A BIAS SPUTTERED INSULATING FILM

This application is a division of application Ser. No. 07/224,171 filed Jul. 25, 1988, now U.S. Pat. No. 5,028,981, which is a continuation of application Ser. No. 06/932,221 filed Nov. 18, 1986 (now abandoned), which is a continuation in part of application Ser. No. 06/809,883 filed Dec. 17, 1985 (now abandoned).

FIELD OF THE INVENTION

This invention relates to an improved interlayer insulating film or passivation film used in a semiconductor device and a method of manufacturing same.

DESCRIPTION OF THE PRIOR ART

FIG. 1 is a cross-sectional illustration of an insulating film formed by using the conventional CVD (chemical vapor deposition) method. In FIG. 1, an interconnection 2 of, e.g., Al is formed on a semiconductor substrate 1 and an insulating film 4 is formed by using the CVD method to cover the semiconductor substrate 1 and Al interconnection 2. As can be clearly seen in FIG. 1, when an insulating film is formed by using the CVD method, it often happens that the coverage of the insulating film 4 is poor and, further, necking takes place in step portions. This drawback is peculiar to the CVD method and could be remedied to some extent by suitably selecting the film forming conditions, but cannot be completely eliminated, forming the greatest obstacle to the formation of multilayer interconnections and the like. Thus, the bias sputtering method has been invented to eliminate the aforesaid drawback peculiar to the CVD method.

FIG. 2 is a cross-sectional illustration of an insulating film formed by using the bias sputtering method. In FIG. 2, after an Al interconnection 2 has been formed on a semiconductor substrate 1, a flat insulating film 3 is formed by using the bias sputtering method to cover the semiconductor substrate 1 and Al interconnection 2. As can be seen in FIG. 2, the insulating film forming method using the bias sputtering method is an epochal one capable of perfectly planarizing the insulating film 3 under particular conditions even if there are step portions due to the presence of the Al interconnection 2. Particularly where the width of the interconnection 2 is less than twice the thickness of an insulating film to be formed thereon, perfect planarization of the insulating film 3 is possible. The bias sputtering method consists in performing sputter etching by applying a bias voltage to the substrate 1 while performing deposition of the film according to the usual sputtering method. In this case, since the sputter etching is higher in etching rate at step portion than at the planar portion, the apparent deposition rate for step portions seems low, and a planar film is thus formed. The mechanism of planarization of insulating films by the bias sputtering method is described in "Study of Planarized Sputter-Deposited SiO$_2$" by C. Y. Ting et al., Journal of Vacuum Science and Technology, Vol. 15, No. 3, May/June, 1978, pp. 1105–1112.

The process of forming a planar insulating film by the bias sputtering method will now be described.

FIG. 3 is a sectional view showing the process of forming insulating films by the bias sputtering method. As can be seen in FIG. 3, in the bias sputtering method, insulating films are successively formed on an Al interconnection 2 as indicated by reference numerals 51 through 54. In this connection, if the pattern width of the Al interconnection 2 is small, as shown in FIG. 2, the insulating film can be easily planarized even if the insulating film is not deposited so thick on the Al interconnection 2. However, in the bias sputtering method, planarization of insulating films is proceeded in such a manner that the width of the underlying pattern to be covered is gradually decreased, as indicated by the reference numerals 51 through 54. Therefore, as shown in FIG. 4, if a wide Al interconnection 2 such as a power supply line is an underlying pattern to be covered, for perfect planarization of an insulating film 3 to be formed by the bias sputtering method it has been necessary that the film be sufficiently thick. To eliminate this drawback, a method has been proposed in which if the underlying pattern to be covered is wide, sputtering is performed by changing the substrate bias voltage midway through the process.

A method of forming planar insulating films using a two-step RF bias sputtering method is disclosed in Japanese Patent Application Laid-Open No. 200440/1984, applied for patent Apr. 28, 1983 by T. Mogami et al., "Method of Manufacturing an Interconnection Structure", and "SiO$_2$ Planarization by RF Bias Sputtering" by T. Mogami, 25th Symposium on Semiconductor Integrated Circuits Technique, Dec. 26, 1983.

The method of forming planar insulating films by the two-step RF bias sputtering method will now be described.

FIG. 5 is a view showing the process of formation of insulating layers by the bias sputtering method when a pattern is wide. In FIG. 5, a wide Al interconnection 2 is formed on a semiconductor substrate 1, and an interlayer insulating film 3 is formed thereon. This improved method will now be described with reference to FIG. 5. First, an oxide film 3 is formed by the bias sputtering method with a relatively low substrate bias voltage applied. At this time, as indicated by the reference numeral 61, there is formed an insulating film having a smoother coverage than that obtained by using the CVD method.

Then, the bias voltage is increased so that in the planar portion the rate of deposition by sputtering is equal to the rate of sputter removal. As a result, seemingly, there is neither deposition nor removal taking place in the planar portion, whereas in the step portions the sputter removal rate is higher than the sputter deposition rate, so that as indicated by the reference numerals 61 through 64 the removal proceeds to make planarization of insulating films possible. Even with this method, however, if the pattern width of the Al interconnection 2 is large, it takes a long time to planarize the insulating film and hence the time required to process one wafer or the like is very long; thus, the processing capacity has substantially been limited.

On the other hand, to increase the processing capacity, if the film is left as it is in the state shown at 61 in FIG. 5, then the step portion of the pattern of the Al interconnection 2 will have a thin region 7 of small effective thickness formed therein as shown in FIG. 6, leading to dielectric breakdown etc., which has been an obstacle to usage.

As described above, in the conventional bias sputtering method, though the coverage of the insulating film being formed is improved, perfect planarization of the insulating film being formed makes it necessary to increase the film thickness or to change the bias condition midway through the process for sputtering.

If insulating films are deposited to the thickness usually required of the planar portion by simply using the bias sputtering method, thin film portions are formed locally and particularly in the step portions, where dielectric breakdown will take place, which has been a problem in use.

In my co-pending prior U.S. application identified supra, the foregoing problems are largely avoided by the provision of a dummy pattern formed along the outer periphery of an underlying pattern or interconnection covered with a planar insulating film. The dummy pattern, as disclosed in my co-pending application, is preferably formed of an insulating material and essentially functions to increase the thickness of the insulating film proximate the peripheral edges of the underlying pattern or interconnect and, by increasing the insulating film thickness in these peripheral regions, dielectric breakdown tends to be advantageously avoided.

Since the underlying pattern or interconnection is formed of a conductive film surrounded by a dummy pattern preferably formed of nonconductive material as disclosed in my said co-pending application, separate masks are required to form the dummy pattern and interconnection film in both separate and non-simultaneously formed manufacturing steps which tends to increase the manufacturing costs of the semiconductor device. Additionally, separate attention must be paid to mask alignment as regards forming the dummy pattern and the interconnection in my co-pending application.

SUMMARY OF THE INVENTION

It is accordingly one object of the present invention to provide a semiconductor device and manufacturing method therefor that avoids the foregoing disadvantages and which is capable of being formed with an insulating film with improved coverage both easily and economically.

Another object of the invention is to provide a semiconductor device having a dummy pattern peripherally formed about an interconnection film layer wherein both the dummy pattern and interconnection film are each formed of conductive material in spaced relationship from each other.

Still another object is to provide a dummy pattern of conductive material that is electrically isolated from the interconnection film.

Still a further object is to provide a method of manufacturing a semiconductor device wherein the conductive dummy pattern and interconnection film which it surrounds are simultaneously formed in a single step.

A semiconductor device, in accordance with the present invention, comprises a semiconductor substrate with a conductive interconnection film formed on a predetermined region thereof. A dummy pattern is formed around the outer periphery of the conductive interconnection film. In accordance with the invention, the dummy pattern is formed of electrically isolated conductive film. An insulating film is formed on the semiconductor substrate by the bias sputtering method to cover the conductive interconnection film and the dummy pattern.

Preferably, the dummy pattern is formed in spaced relationship to the conductive interconnection film resulting in electrical isolation of the dummy pattern. In accordance with a method of manufacturing the semiconductor device of the present invention, the dummy portion and interconnection film are preferably formed simultaneously with a single mask. Thus, when a dielectric film is employed both for the dummy pattern and underlying interconnection film, the spaced relation between the dummy pattern and the interconnection film has the advantage that the dummy pattern is easily formed without special attention to mask alignment or special forming processes as previously required.

When a conductive film of the same material as that of the interconnection film is employed for the dummy pattern, it is important to maintain the dummy pattern separated from the interconnection film to prevent a short circuit between the interconnection film and an overlying interconnection film if degradation of step coverage at the dummy pattern occurs which might cause a short circuit between the dummy pattern and an overlying interconnection film. The conductive but electrically isolated dummy pattern has the further advantage, as discussed supra that the dummy pattern and interconnection film are simultaneously formed with a single mask without any additional manufacturing processes.

Other objects and features of the present invention will become apparent to those skilled in the art from the following detailed description to be given with reference to the accompanying drawings.

BEST MODE FOR CARRYING OUT THE INVENTION

An embodiment of the invention will now be described with reference to the drawings.

Figure 7:
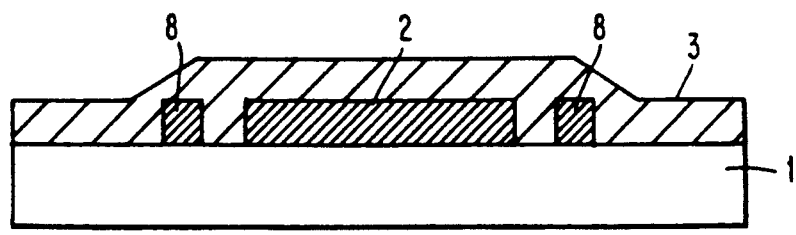
FIG. 7 is a sectional view schematically showing the construction of an insulating film, wherein a dummy pattern is provided according to an embodiment of the invention.

FIG. 7 is a cross-sectional illustration of a semiconductor device according to an embodiment of the invention. In FIG. 7, an underlying pattern 2 to be covered is, for example, an Al interconnection formed on a semiconductor substrate 1. As an important feature of the present invention, dummy pattern 8 is formed close to and around the outer periphery of Al interconnection 2. As can be seen from the drawing, both dummy pattern 8 and interconnection 2 are preferably formed of the same conductive material in a single manufacturing step utilizing a single mask. An interlayer insulating film 3 is formed by the bias sputtering method to cover the substrate 1, the Al interconnection 2 and the dummy pattern 8. An embodiment of the invention will now be described with reference to FIG. 7.

Figure 1:
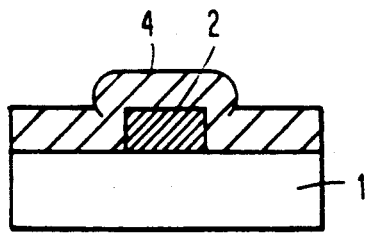
FIG. 1 is a view schematically showing the construction of an insulating film formed by using the conventional CVD method.
Figure 2:
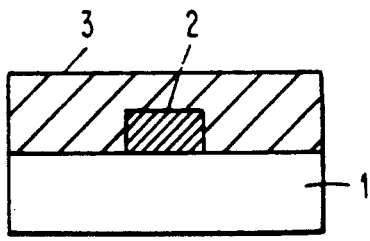
FIG. 2 is a view schematically showing the construction of an insulating film formed by the conventional bias sputtering method.
Figure 3:
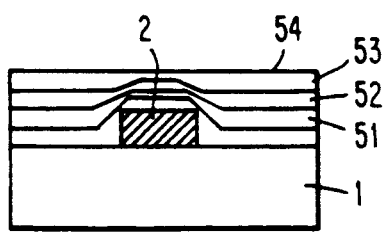
FIG. 3 is a view showing the process for forming an insulating film by the bias sputtering method.
Figure 4:
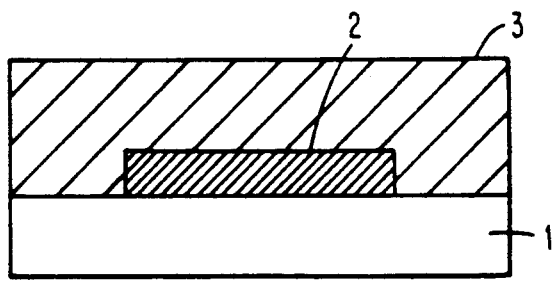
FIG. 4 is a view schematically showing the construction of a planar film formed by using the bias sputtering method when an underlying pattern to be covered is wide.
Figure 5:
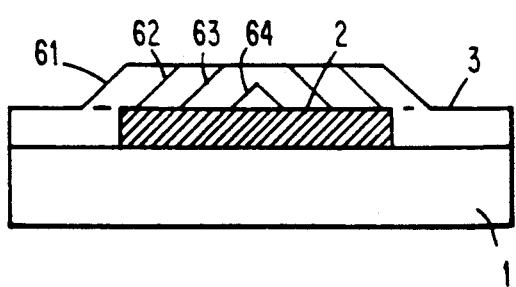
FIG. 5 is a view showing the process for forming an insulating film, wherein the insulating film is planarized by changing the substrate bias when an underlying pattern to be covered is wide.
Figure 6:
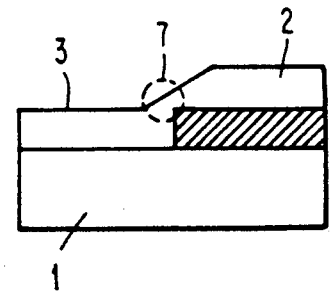
FIG. 6 is a view showing a thin film portion with a small effective thickness formed by the bias sputtering method.

As described above, at locations where the width of the pattern of Al interconnection 2 is large, there has been a problem from the standpoint of coverage even if an interlayer insulating film is formed using the bias sputtering method. In the present invention, to eliminate the aforesaid drawback, a dummy pattern 8 as shown in FIG. 7 is formed along and about the outer periphery of the wide Al interconnection 2. The width of the Al interconnection 2 is preferably more than twice the thickness of an insulating film to be formed thereon. Next, an insulating film 3 is formed using the bias sputtering method. If it is formed using the conventional CVD method, the space between Al interconnection 2 and dummy pattern 8 cannot be effectively filled with insulating film and moreover, the aforesaid necking and coverage imperfection will occur. However, in the present invention, the affect of bias sputtering makes it possible to completely fill the space between Al interconnection 2 and dummy pattern 8 and to perfectly planarize the regions over the separation space therebetween. Further, by virtue of forming dummy pattern 8 along and about the outer periphery of Al interconnection 2, the aforesaid thin film portions with a small effective thickness (as shown at 7 in FIG. 6) are formed proximate dummy pattern 8 rather than Al interconnection 2. Further, the use of the bias sputtering method ensures that the coverage of insulating film 3 at dummy pattern 8 is much better than that obtained by the conventional CVD method. Although in the present invention dummy pattern B is a conductive material since it is electrically isolated from interconnection 2 there is little if any chance of short circuiting between the interconnection 2 and an overlying conductive layer (not shown in the event said overlying layer electrically contacts dummy pattern 8 as at 7.

In addition, in the above embodiment, the film formed by the bias sputtering method has been described as an interlayer insulating film. However, the same effect as that described above can be obtained in forming a passivation film by applying the present invention.

In the above embodiment, while the underlying pattern to be covered has been described as an Al interconnection, it is not limited thereto and, it goes without saying that the same effect can be obtained if it is, for example, an aluminum alloy interconnection.

As described above, in the present improvement invention, after dummy pattern 8 has been formed along and around the outer periphery of a wide underlying pattern 2 both simultaneously therewith and preferably using a single mask, an insulating film layer 3 is formed using the bias sputtering method. Therefore, there is no need to introduce new troublesome processing steps as compared with the prior art. Additionally, there is no need to require separate masks and separate processing steps in the fabrication of dummy pattern 8 and thereafter interconnection 2 as disclosed in my co-pending application. Also, there is no possibility of imperfections such as dielectric breakdown due to unsatisfactory coverage as in the prior art CVD method. There is no need to increase the thickness of an insulating film 3 to be deposited or to change the substrate bias voltage midway through film deposition which are needed when bias sputtering method alone is used. Therefore, according to the invention, a planar insulating film with good coverage can be obtained easily and at low cost. Further, a highly reliable insulating film can be easily obtained without lowering the processing capacity of the bias sputtering method.

Although the present invention has been described and illustrated in detail, it is clearly understood that the same is by way of illustration and exemplary only and is not intended to be taken as limitative, the spirit and scope of the present invention being limited only by the terms of the appended claims therein.

What is claimed is:

1. A method of manufacturing a semiconductor device, comprising the steps of:
   providing a semiconductor substrate;
   simultaneously forming a conductive interconnection film on a predetermined region of said substrate while forming a dummy pattern about the outer periphery of said conductive interconnection film and in spaced relation to said film, said dummy pattern being formed of electrically isolated conductive film and by utilizing the same mask as that employed for the interconnection; and
   providing an insulating film on said semiconductor substrate by the bias sputtering method to cover said conductive interconnection film and said conductive dummy pattern whereby said dummy pattern has no electrical connection anywhere within said semiconductor device and is thereby electrically isolated from any electrically conductive structures within the device.

2. The method of claim 1, wherein the substrate bias voltage is maintained at a substantially constant level during depositing of insulating film.

3. A method of manufacturing a semiconductor device, comprising the steps of:
   providing a semiconductor substrate;
   forming a conductive interconnection film on a predetermined region of said substrate;
   forming a dummy pattern about the outer periphery of said conductive interconnection film and in spaced relation to the entire outer periphery of said film, said dummy pattern being formed of electrically isolated conductive film; and
   providing an insulating film on said semiconductor substrate by the bias sputtering method to cover said conductive interconnection film and said conductive dummy pattern;
   whereby said dummy pattern has no electrical connection anywhere within said semiconductor device and is thereby electrically isolated from any electrically conductive structures within the device.

4. The method of claim 3, wherein said conductive interconnection film and said dummy pattern are formed simultaneously by utilizing the same mask as that employed for the interconnection.

* * * * *